(12) United States Patent
George et al.

(10) Patent No.: US 6,261,723 B1
(45) Date of Patent: *Jul. 17, 2001

(54) TRANSFER LAYER REPAIR PROCESS FOR ATTENUATED MASKS

(75) Inventors: Merrilou George, Jericho; Timothy E. Neary, Essex Junction, both of VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/262,370

(22) Filed: Mar. 4, 1999

(51) Int. Cl.⁷ .................................................. G03F 9/00
(52) U.S. Cl. ................................................. 430/5; 382/144
(58) Field of Search .................................. 430/311, 313, 430/5, 316, 22, 30; 382/144

(56) References Cited

U.S. PATENT DOCUMENTS

| | | | |
|---|---|---|---|
| 4,340,654 | 7/1982 | Campi | 430/5 |
| 4,510,222 | 4/1985 | Okunaka et al. | 430/5 |
| 4,636,403 | 1/1987 | Fisanick et al. | 427/53.1 |
| 4,778,693 | 10/1988 | Drozdowicz et al. | 427/53.1 |
| 4,874,632 | 10/1989 | Nakagawa et al. | 427/41 |
| 4,952,421 | 8/1990 | Morimoto et al. | 427/43.1 |
| 5,011,580 | 4/1991 | Pan et al. | 204/15 |
| 5,273,849 | 12/1993 | Harriott et al. | 430/5 |
| 5,464,713 | * 11/1995 | Yoshika et al. | 430/5 |
| 5,506,080 | * 4/1996 | Adair et al. | 430/5 |
| 5,783,337 | * 7/1998 | Tzu et al. | 430/5 |
| 5,945,237 | * 8/1999 | Tanabe | 430/5 |
| 5,981,110 | * 11/1999 | George et al. | 430/5 |

* cited by examiner

*Primary Examiner*—Mark F. Huff
*Assistant Examiner*—Saleha R. Mohamedulla
(74) *Attorney, Agent, or Firm*—DeLio & Peterson, LLC; John J. Tomaszewski; Howard J. Walter, Jr.

(57) ABSTRACT

A method and apparatus for repairing transparent defects in a transfer layer circuit pattern in the process of fabricating an attenuated mask is provided comprising forming a sacrificial removable layer on the transfer layer including the part of the transfer layer having a transparent defect and then forming a patch to cover the transparent defect. After applying the sacrificial removable layer and patch, the sacrificial removable layer and unwanted exposed attenuated mask material is removed leaving the patch having an undercoating of sacrificial removable layer in the transparent defect region. The undercoat sacrificial removable layer is then at least partially etched and the patch and sacrificial layer removed by a lift off procedure. The transfer layer is then removed leaving the attenuated mask having the desired circuit pattern on the surface of the transparent mask substrate. Attenuated masks made using the method and apparatus of the invention are also provided.

9 Claims, 3 Drawing Sheets

TRANSFER LAYER REPAIR PROCESS FOR ATTENUATED MASKS

BACKGROUND OF THE INVENTION

1. Field of the Invention

This invention relates to a method and apparatus for repairing defects in photomasks generally used in the manufacture of semiconductor microcircuits and other electronic components to transfer a circuit pattern onto a workpiece, and, in particular, to repairing transparent defects in the process of making an attenuated mask using a transfer layer step. The defects are in the form of pin holes or entire missing portions in the transfer layer mask pattern which defects are transferred to the attenuated mask and eventually to the electronic component substrate during use of the attenuated mask.

2. Description of Related Art

In the manufacture of circuit patterns on electronic components such as the manufacture of integrated circuits on semiconductor substrates, photomasks are used to transfer the desired circuit pattern onto the substrate workpiece. A typical conventional photomask comprises a patterned metal film such as chromium, nickel or aluminum in a thickness of about 1000 Å deposited on a transparent base such as glass or quartz. The photomask is generally manufactured by depositing a thin layer of the metal on the surface of the transparent substrate, coating the film metal with a photoresist, exposing the desired pattern on the photoresist coating, developing the photoresist coating, and removing the metal from the developed areas of the film by etching then removing the remaining photoresist leaving a patterned metal film on the substrate.

The pattern contained in the photomask is reproduced onto the surface of the workpiece typically by placing the mask over the workpiece and irritating a radiation-sensitive resist material on the workpiece. The variety of radiation sources include visible light, ultraviolet light, x-ray radiation, electrons and ions. When illuminated by the radiation, the metal pattern on the photomask serves to selectively block portions of the radiation beam while allowing other portions to be transmitted through the non-metallized areas. In this procedure, complex geometry having very narrow line widths can be reproduced allowing an economical production of very large scale integrated circuits and other electronic devices.

The type of mask to which this invention is particularly directed is an attenuated mask which is built using a transfer layer of chrome that allows the chrome to act as a mask to the attenuated film under the chrome layer. The transfer layer of chrome is generally patterned as noted above with the difference being that the chrome will eventually be removed exposing a pattern of attenuated mask material under the chrome forming the desired attenuated mask circuit pattern.

To make an attenuated mask, an attenuation layer is formed on a substrate such as glass or quartz by coating a layer of an attenuated mask material such as molybdenum silicide (MoSi) on the substrate surface. A chrome transfer layer is then applied over the attenuated mask material coating and is patterned as discussed above to form the desired chrome pattern and ultimately the desired attenuated mask material pattern which is under the chrome pattern on the substrate surface.

If there are defects in the chrome pattern such as missing chrome these are termed transparent defects and can take the form of pinholes or entire missing portions of the chrome film. Such defects in the chrome are also transferred to the attenuated mask material and to the mask during the development step. This is a serious problem since matching of the phase and transmission properties of the attenuated mask material is currently impossible.

To eliminate the transfer of the transparent defects into the attenuated film, a repair is generated that is resistant to the etch of the final attenuated film such as a plasma etch. This is typically accomplished using a FIB patch made primarily of gold and carbon. This material is inert to the etch used to remove the attenuated mask material such as MoSi. Unfortunately, the patch is also inert when the chrome is to be etched so that when the chrome is removed from the mask, the gold and carbon patch material remains because of the inability of the chrome etch to attack the patch material. With such residual or remaining patches on the mask, the attenuated film properties are effected and cause printed defects on the wafer substrate when imaged using the attenuated mask.

A number of patents have issued in the area of repairing defective conventional chrome photomasks and include U.S. Pat. Nos. 4,340,654; 4,510,222; 4,636,403; 4,778,693; 4,874,632; 5,011,580; and U.S. Pat. No. 5,273,849. These patents discuss the various types of conventional photomasks and the different methods employed to repair transparent type defects on the photomasks and the disclosures of each of the above patents are hereby incorporated by reference.

The following description will be directed to the repair of attenuated phase shift masks which may be made using a variety of attenuated mask materials such as MoSi, carbon and silicon nitride but it will be appreciated by those skilled in the art that the invention applies to other masks where repair of transparent defects is needed.

Bearing in mind the problems and deficiencies of the prior art, it is therefore an object of the present invention to provide a method to repair transparent defects in the fabrication process for making attenuated masks which are used to make electronic components such as semiconductors.

It is another object of the present invention to provide an apparatus to repair transparent defects in the fabrication process for making attenuated photomasks used to make semiconductors and other electronic components.

A further object of the invention is to provide attenuated photomasks made in accordance with the method and apparatus of the invention.

Other advantages of the invention will be readily apparent from the following description.

SUMMARY OF THE INVENTION

The above and other objects and advantages, which will be apparent to one of skill in the art, are achieved in the present invention which is directed, in a first aspect, to a method of forming defect free mask transfer layers comprising the steps of:

a) forming image segments in a mask transfer layer on a substrate;

b) inspecting the substrate for defects;

c) repairing the defects; and d) removing the mask transfer layer.

In another aspect a transfer layer fabrication method is provided for making an attenuated mask which requires a repair step to repair transparent defects in the transfer layer comprising the steps of:

supplying a transparent mask substrate;

depositing a layer of attenuated mask material on the mask substrate;

forming a metallic transfer layer on the attenuated mask material layer in a desired mask pattern leaving unwanted attenuated mask material exposed;

inspecting the metallic layer for transparent defects wherein metal is missing from the desired transfer layer design leaving wanted attenuated mask material exposed and forming transparent defects;

applying a sacrificial removable layer on the metallic transfer layer and wanted and unwanted attenuated mask material;

applying a patch material on top of the sacrificial removable layer in the transparent defect missing portion of the metallic transfer layer;

etching the sacrificial removable layer and unwanted exposed attenuated mask material;

contacting the etched substrate with an etchant which undercuts the patch material and at least partially etches the sacrificial removable layer under the patch material;

removing the patch material and remaining sacrificial removable layer; and etching the metallic layer forming the attenuated mask which comprises the attenuated mask material in the form of the desired circuit pattern on the transparent mask substrate.

In a further aspect of the invention, a method is provided for repairing transparent defects in a transfer layer, typically metal, in the process for making attenuated masks using a transfer layer which covers wanted attenuated mask material leaving unwanted attenuated mask material exposed wherein the attenuated mask comprises a circuit pattern of an attenuated mask material (in either a negative or positive form), on a transparent mask substrate which attenuated mask pattern is transferred to an electronic component substrate the method comprising the steps of:

inspecting the metallic layer for transparent defects wherein metal is missing from the desired transfer layer design leaving wanted attenuated mask material exposed and forming transparent defects;

applying a sacrificial removable layer on the transfer layer and wanted and unwanted attenuated mask material;

applying a patch material on top of the sacrificial removable layer in the transparent defect missing portion of the metallic transfer layer;

etching the sacrificial removable layer and unwanted exposed attenuated mask material;

contacting the etched substrate with an etchant which undercuts the patch material and at least partially etches the sacrificial removable layer under the patch material;

removing the patch material and remaining sacrificial removable layer; and etching the metallic layer forming the attenuated mask which comprises the attenuated mask material in the form of the desired circuit pattern on the transparent mask substrate.

In another aspect of the invention, an apparatus is provided for repairing transparent defects in a transfer layer in the process of making attenuated masks made using a transfer layer process wherein the attenuated mask has a circuit pattern of an attenuated mask material thereon which pattern is transferred to an electronic component substrate comprising:

holding means for securing an attenuated mask substrate having a circuit pattern thereon in the form of a transfer layer on an attenuated mask material on a transparent mask substrate, the transfer layer being in the desired mask pattern covering wanted attenuated mask material leaving unwanted attenuated mask material exposed;

detecting means for locating and identifying a transparent defect in the transfer layer exposing wanted attenuated mask material;

application means to form a sacrificial removable layer on the transfer layer and exposed wanted and unwanted attenuated mask material;

application means for applying a patch material on top of the sacrificial removable layer in the transparent defect missing portion of the transfer layer;

a first etching means to etch the sacrificial removable layer and unwanted exposed attenuated mask material;

a second etching means for etching the etched substrate to remove at least some of the sacrificial removable layer under the patch material;

removing means for removing the patch material and any remaining sacrificial removable layer under the patch material; and a third etching means for etching the transfer layer forming the attenuated mask in the form of attenuated mask material in the desired mask pattern on the transparent mask substrate.

Attenuated masks made by the method and apparatus of the invention are also provided herein.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
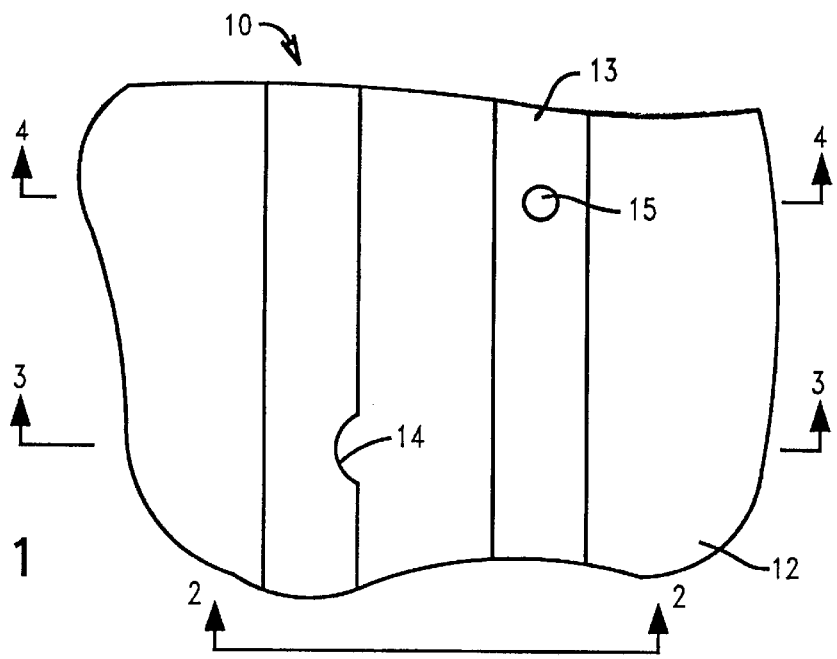
FIG. 1 is a top plan view of a chrome transfer layer needing repair which layer is on a film of attenuated mask material.

In describing the preferred embodiments of the present invention, reference will be made herein to FIGS. 1–6E of the drawings in which like numerals refer to like features of the invention. Features of the invention are not necessarily shown to scale in the drawings.

The present invention is used to repair transparent defects in photomasks and any type photomask may be repaired using the method and apparatus of the invention. For convenience, however, the following description will be directed to attenuated mask material on quartz photomasks (attenuated photomasks) which are made using a metallic transfer layer to form the desired attenuated mask design on the quartz transparent substrate.

Attenuated masks typically comprise an attenuated mask material such as molybdenum silicide (MoSi) to form the attenuating design on the quartz, glass or other transparent substrate. The silicide film is typically on the order of about 1000 Å. Also for convenience, the following description will be directed to the repair of patterns in the form of parallel conductor lines but it will be appreciated by those skilled in the art that other type patterns (e.g., pads) may likewise be repaired using the method and apparatus of the invention.

Basically, the invention comprises a method for repairing a transparent defect in a transfer layer used during the fabrication process for making an attenuated mask. An inspection technique is employed to determine the location of transparent defects in the transfer layer and a sacrificial layer of metal is then applied to the complete substrate surface including the transfer layer, wanted attenuated mask material exposed by the defect and unwanted exposed attenuated mask material. A patch is then applied to cover the transparent defect. The exposed sacrificial metal layer and the unwanted exposed MoSi layer is then removed leaving the transfer layer, patch and the sacrificial layer under the patch and on top of the wanted attenuated mask material. The sacrificial layer under the patch is then at least partially etched and the patch and sacrificial layer removed. The transfer layer is then removed leaving the desired attenuated mask material on the transparent substrate in the desired circuit pattern.

Figure 6A:
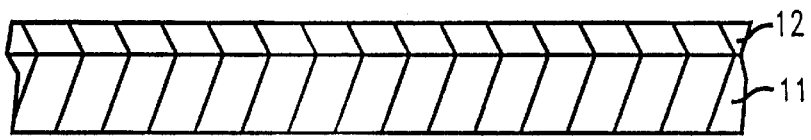
FIGS. 6A–6E show the conventional method of making a attenuated mask using a metallic transfer layer.

Referring first to FIGS. 6A–6E these figures show, in sequence, a conventional method for making an attenuated mask. In FIG. 6A the quartz, glass, or other transparent substrate 11 is overlaid with a coating 12 of an attenuated mask material such as MoSi, carbon and silicon nitride. MoSi is a preferred attenuated mask material and the following description will be directed to this material for convenience. The thickness of the MoSi layer is typically about 600 to 1500 Å.

Figure 6B:
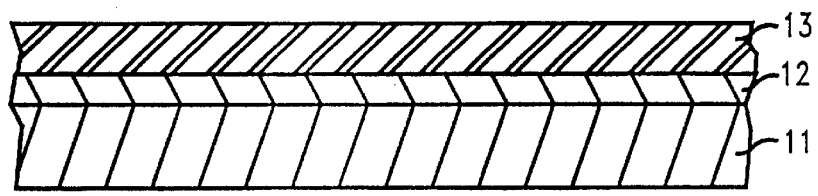

In FIG. 6B, a transfer layer 13 is applied on top of the MoSi layer 12. The transfer layer is typically a metallic material such as chrome and is applied at a thickness typically about 500 to 1500 Å. The function of the metallic layer is to form the desired circuit pattern and allow etching of the unwanted attenuated mask material on the substrate surface.

Figure 6C:
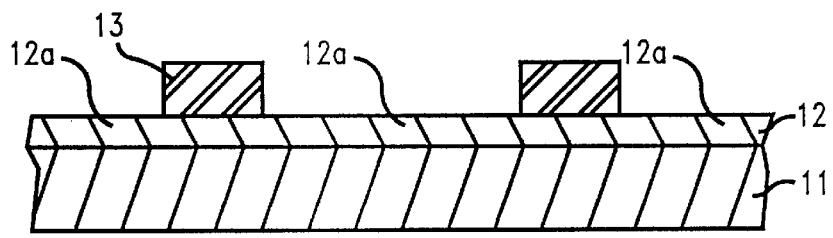

The metallic transfer layer 13 is patterned into the desired attenuated mask circuit pattern as shown in FIG. 6C. The metallic transfer layer 13 is shown in the form of parallel conductor lines although other shapes such as pads, straps, etc. may be patterned and repaired using the method and apparatus of the invention.

Figure 6D:
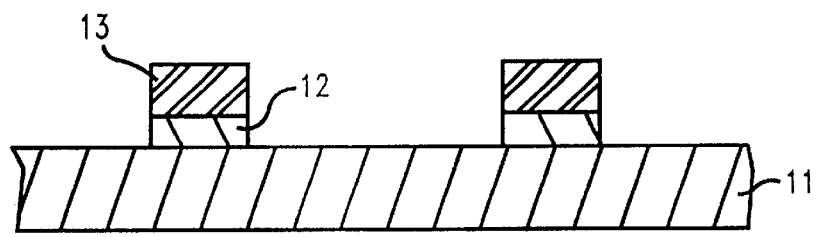
Figure 6E:
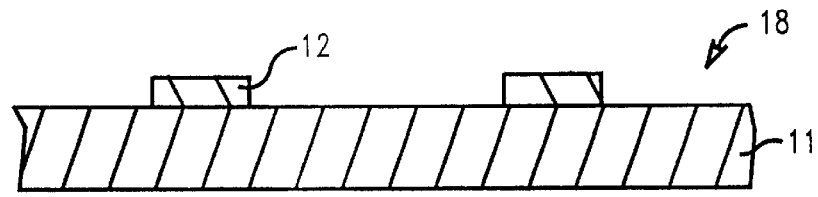

The exposed unwanted MoSi layer 12a is then etched leaving a MoSi layer 12 covered by the chrome pattern 13 as shown in FIG. 6D. The chrome pattern transfer layer is then removed leaving the desired attenuated mask shown generally as 18 in FIG. 6E. Accordingly, the final attenuated mask comprises a transparent substrate 11 having MoSi pattern features 12 on the surface thereof.

Referring now to FIG. 1, chrome or other metal transfer layer lines 13 are shown on the surface of attenuated mask material 12. This configuration shown generally as 10 represents a chrome transfer layer needing repair in the fabrication of an attenuated mask. Accordingly, the chrome lines 13 are shown having a transparent defect 14 wherein part of the chrome line is missing and a transparent defect 15 wherein a pinhole or other opening in the chrome line is missing.

Figure 2:
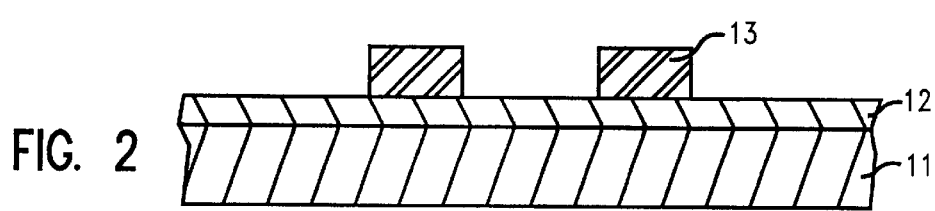
FIG. 2 is a cross-sectional side view of FIG. 1 taken along lines 2—2.

A cross-sectional side view of FIG. 1 is shown in FIG. 2 wherein the metallic transfer layer 13 in the desired circuit pattern is formed on the surface of the attenuated mask material layer 12 which is on top of the transparent layer 11. There are no transparent defects shown in this cross-section.

Figure 3:
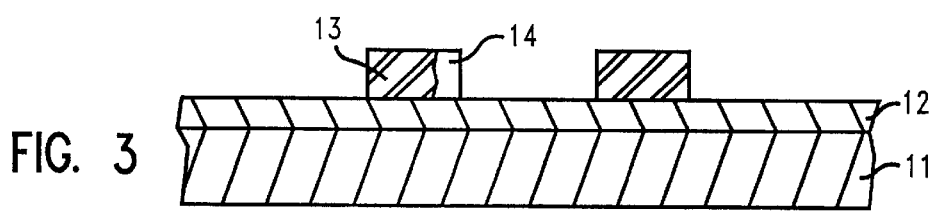
FIG. 3 is a cross-sectional side view of FIG. 1 taken along lines 3—3 and showing a transparent defect in the chrome transfer layer.
Figure 4:
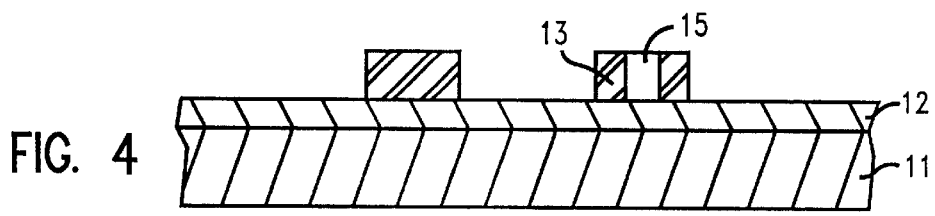
FIG. 4 is a cross-sectional side view taken along lines 4—4 of FIG. 1 showing a pinpoint transparent defect in the chrome transfer layer.

In FIG. 3, the transparent defect 14 is shown in the metallic transfer layer 13. Likewise, in FIG. 4 the pinhole transparent defect 15 is shown in metallic transfer layer 13. It is the defects shown in FIG. 3 and 4 which need to be repaired before the desired attenuated mask can be completed.

Figure 5A:
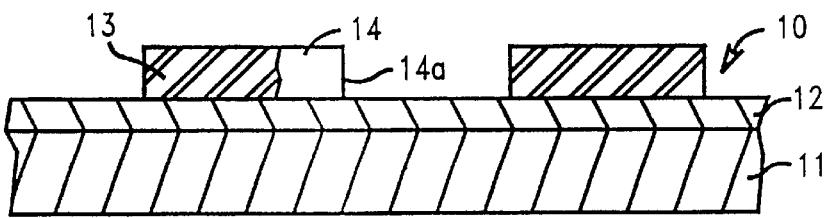
FIGS. 5A–5F show, in sequence, the method of the invention for repairing transparent defects in a transfer layer in the fabrication of an attenuated mask.
Figure 5B:
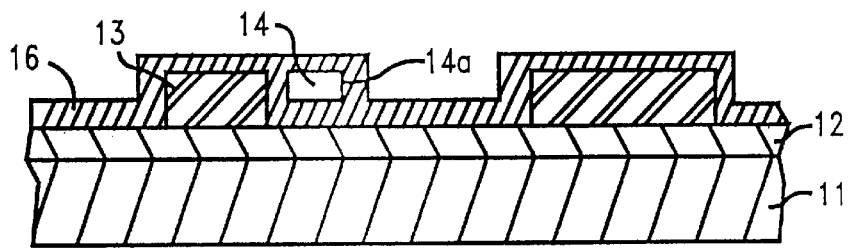
Figure 5C:
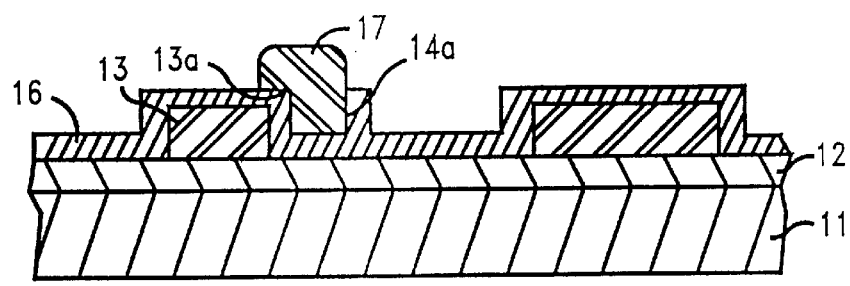

Referring now to FIGS. 5A–5F, a sequence of steps is shown to repair a transfer layer in the transfer layer process of making an attenuated mask using the method of the invention. In FIG. 5A a quartz substrate 11 is shown covered with a coating of an attenuated mask material 12 which is covered with a patterned transfer metallic layer 13 shown having a defect 14 and an edge 14a. The device shown in FIG. 5A is designated generally as 10 and is similar to the design shown in FIGS. 1 and 3.

The structure in FIG. 5A is overcoated with a sacrificial removable layer 16 using a material such as copper. The copper may be deposited by a variety of conventional means such as evaporation, sputtering and usually to a thickness of about 25 Å to 150 Å. Greater thicknesses can be used but may effect placement of final images and overetch of the MoSi. It will be seen that the sacrificial layer 16 covers the transfer layer 13, the sides of the transparent defect 14, edge of the defect 14a and the attenuating material 12.

A patch material 17 is then applied to the defect and typically overlays part of the transfer layer 13 shown as 13a. It will be seen that the patch covers the transparent defect out to its outer edge 14a thereby covering the wanted MoSi layer 12 to its desired design.

Figure 5D:
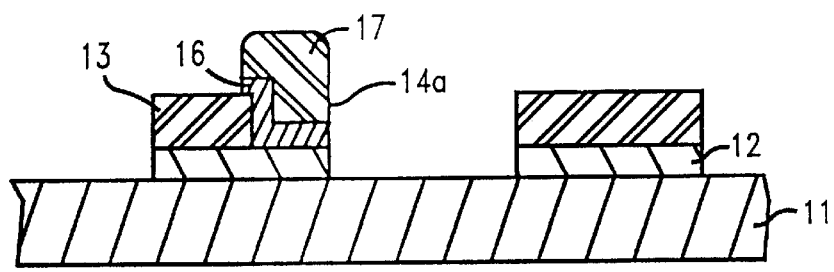
Figure 5E:
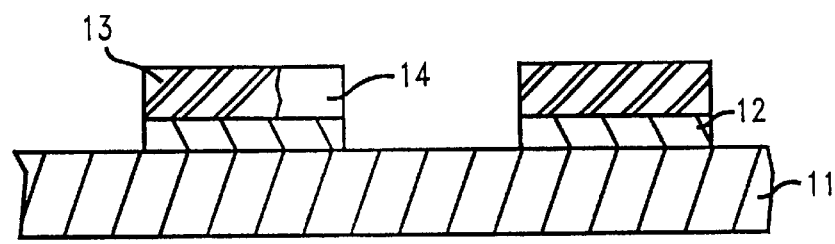

The sacrificial removable layer 16 and the unwanted MoSi layer 12 are then removed by etching with the resulting etched substrate shown in FIG. 5D. This leaves the desired MoSi design 12 covered by the transfer layer 13 and the patch 17 having an undercoating of the sacrificial removable layer 16.

Figure 5F:
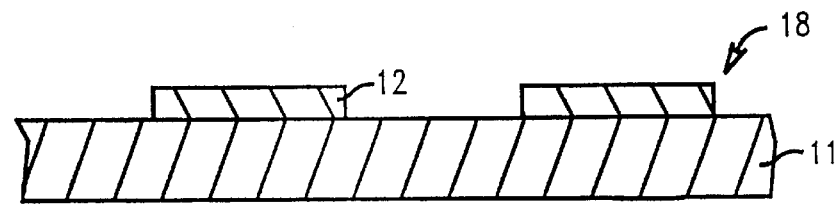

The sacrificial removable layer 16 under the patch is then at least partially etched using a solvent such as dilute nitric acid, e.g., 10%, and the undercoat sacrificial layer 16 and patch 17 removed by a liftoff procedure. The etching is typically performed by immersion of the substrate in the etchant. After the liftoff procedure, the structure is shown as in FIG. 5E and comprises the transparent substrate 11 and the MoSi patterned layer 12 covered by the metallic chrome transfer layer 13. The transparent defect is still present as 14. Upon etching of the chrome layer 13 the desired attenuated mask 18 is formed as shown in FIG. 5F.

Referring back to FIG. 5C, in the application of the patch to the structure, any repair method may be used which provides a patch which covers the transparent defect. Any suitable patch material may be used such as gold and carbon and it may be applied by any of a number of techniques or a deposition technique using a focus ion beam.

A preferred method of applying a patch is by using a focus ion beam (FIB) and is a preferred method of applying the patch. Generally, an organo metallic gas such as dimethylgold trifluoro acetylacetonate is used and the gas is discharged from a gas nozzle and the gas supplied in the vicinity of the defect such as 14 shown in FIG. 1. The defect portion 14 is radiated by the ion beam simultaneously decomposing the gas and the metal. Carbon which is a component of the gas and the metal selectively forms a patch in the defect portion. This repair method is found to be simple and has a high repair resolution of about ±.1 microns making it an extremely effective means for repairing the defects in a pattern.

A preferred patch material is dimethylgold trifluoro acetylacetonate which when decomposed by the FIB provides a gold/carbon patch. The patch preferably overlays part of the transfer layer at the transparent defect as shown in FIG. 5D.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A transfer layer fabrication method for making an attenuated mask which requires a repair step to repair transparent defects in the transfer layer consisting essentially of in the following sequence the steps of:

supplying a transparent mask substrate;

depositing a layer of attenuated mask material on the mask substrate;

forming a metallic transfer layer on the attenuated mask material layer in a desired mask pattern leaving unwanted attenuated mask material exposed;

inspecting the metallic transfer layer for transparent defects wherein metal is missing from a desired transfer layer design leaving wanted attenuated mask material exposed and forming transparent defects;

applying a sacrificial removable layer on the metallic transfer layer and wanted and unwanted attenuated mask material;

applying a patch material on top of the sacrificial removable layer in a transparent defect missing portion of the metallic transfer layer, the patch material covering the transparent defect out to its outer edge to cover the wanted attenuated mask material to the desired transfer layer design;

etching the sacrificial removable layer and unwanted exposed attenuated mask material resulting in a desired circuit pattern in the attenuated mask material;

contacting the etched unwanted exposed attenuated mask material with an etchant which undercuts the patch material and at least partially etches the sacrificial removable layer under the patch material;

removing the patch material and remaining sacrificial removable layer; and etching the metallic transfer layer forming the attenuated mask which comprises the attenuated mask material in the form of the desired circuit pattern on the transparent mask substrate.

2. The method of claim 1 wherein the attenuated mask material is MoSi.

3. The method of claim 1 wherein the metallic transfer layer is chrome.

4. The method of claim 1 wherein the sacrificial removable layer is copper.

5. A method for repairing transparent defects in a metallic transfer layer in the process for making attenuated masks using a transfer layer which covers wanted attenuated mask material leaving unwanted attenuated mask material exposed wherein an attenuated mask comprises a desired circuit pattern of an attenuated mask material in either a negative or positive form on a transparent mask substrate where are attenuated mask pattern is transferred to an electronic component substrate the method comprising the steps of:

inspecting the metallic transfer layer for transparent defects wherein metal is missing from a desired transfer layer design leaving wanted attenuated mask material exposed and forming transparent defects;

applying a sacrificial removable layer on the metallic transfer layer and wanted and unwanted attenuated mask material;

applying a patch material on top of the sacrificial removable layer in a transparent defect missing portion of the metallic transfer layer;

etching the sacrificial removable layer and unwanted exposed attenuated mask material;

contacting the etched unwanted exposed attenuated mask material with an etchant which undercuts the patch material and at least partially etches the sacrificial removable layer under the patch material;

removing the patch material and remaining sacrificial removable layer; and etching the metallic transfer layer forming the attenuated mask which comprises the attenuated mask material in the form of the desired circuit pattern on the transparent mask substrate.

6. The method of claim 5 wherein the attenuated mask material is MoSi.

7. The method of claim 5 wherein the metallic transfer layer is chrome.

8. The method of claim 5 wherein the sacrificial removable layer is copper.

9. The method of claim 8 wherein the etchant for undercutting the patch material is nitric acid.

* * * * *